United States Patent [19]

Andrus et al.

[11] 4,358,541

[45] Nov. 9, 1982

[54] GLASS-CERAMIC COATINGS FOR USE ON METAL SUBSTRATES

[75] Inventors: Ronald L. Andrus, Elmira; Kenneth Chyung, Painted Post, both of N.Y.; Richard F. Reade, deceased, late of Corning, N.Y.; by Clara M. Reade, administratrix, Flushing, N.Y.

[73] Assignee: Corning Glass Works, Corning, N.Y.

[21] Appl. No.: 323,920

[22] Filed: Nov. 23, 1981

[51] Int. Cl.$^3$ .............................................. C03C 3/22
[52] U.S. Cl. .................................... 501/5; 501/8; 501/9; 501/63; 501/65; 501/66; 501/67; 501/69; 501/70; 501/72; 501/73; 501/77; 501/79
[58] Field of Search .................... 501/5, 8, 9, 63, 65, 501/66, 67, 69, 70, 72, 73, 77, 79

[56] References Cited

U.S. PATENT DOCUMENTS

| | | | |
|---|---|---|---|
| 3,819,387 | 6/1974 | Leger et al. | 501/5 |
| 3,881,944 | 5/1975 | Beall et al. | 501/5 |
| 3,901,716 | 8/1975 | Rogers et al. | 501/5 |
| 4,256,796 | 3/1981 | Hang et al. | 501/5 |

*Primary Examiner*—M. L. Bell
*Attorney, Agent, or Firm*—Clinton S. Janes, Jr.

[57] ABSTRACT

The present invention is directed to the production of glass-ceramic coatings capable of being fired repeatedly to temperatures in excess of 950° C. without thermal deformation and being especially suitable for application to titanium-stabilized stainless steels. The coatings are highly crystalline, substantially free from alkali metal oxides, and consist essentially, by weight, of:

| | |
|---|---|
| MgO | 5–35 |
| CaO | 0–35 |
| ZnO | 0–25 |
| CaO + ZnO | 10–35 |
| $Al_2O_3$ | 0–10 |
| $B_2O_3$ | 0–25 |
| $P_2O_5$ | 0–10 |
| $B_2O_3 + P_2O_5$ | 4–25 |
| $SiO_2$ | 25–50 |

3 Claims, No Drawings

GLASS-CERAMIC COATINGS FOR USE ON METAL SUBSTRATES

BACKGROUND OF THE INVENTION

U.S. Pat. No. 4,256,796 discusses the developmemt of electronic circuit boards consisting basically of a substrate coated with a dielectric material upon the surface of which the required conductive metal circuitry is formed. The substrates or circuit boards, as such have been commonly termed, have been fabricated from organic plastics, ceramic wafers, and porcelain-coated steel. Each of those materials displays certain deficiencies.

For example, organic plastics suffer from low temperature capability, i.e., they cannot be subjected to temperatures greater than about 400° C. That circumstance limits the manufacturing process for applying the metal circuitry upon the surface thereof to low temperature techniques. Newer methods for applying the circuitry have been developed which are lower in cost and provide improved reliability and electrical accuracy, but which demand firing temperatures in excess of 600° C. Such new processes are not applicable with substrates prepared from organic plastics.

Ceramic substrates, such as alumina wafers, can be repeatedly exposed to temperatures in excess of 600° C. without failure but the materials are expensive, difficult to fabricate into large and complex shapes, and cannot be readily machined or have holes punched therein. Moreover, the wafers have proven to be relatively fragile.

Porcelain-coated steel boards have experienced the problem of unevenness in the thickness of the porcelain layer. Furthermore, the available porcelains were subject to flow at temperatures of 500°-600° C., brown plague, blisters, pinholes, and poor adhesion to the steel substrate because of substantial differences existing between the coefficients of thermal expansion of the porcelain and the steel board.

U.S. Pat. No. 4,256,796 discloses the fabrication of porcelain-coated, metal circuit boards wherein the "porcelain" is a devitrified glass having a composition which is substantially free from alkali metal oxide and consists essentially, expressed in terms of mole percent on the oxide basis, of

| | |
|---|---|
| BaO | 6-25 |
| MgO + optionally CaO and/or ZnO | 30-60 |
| $B_2O_3$ | 13-35 |
| $SiO_2$ | 10-25 |

Although a direct conversion of ranges expressed in mole percent to ranges stated in weight percent is not possible, the following table provides an approximation of the disclosed compositions (also utilizing the working examples of the patent) in weight percent.

| | |
|---|---|
| BaO | 16-50 |
| MgO | 16-42 |
| CaO | 0-11 |
| ZnO | 0-11 |
| CaO + ZnO | 0-11 |
| $B_2O_3$ | 12-34 |
| $SiO_2$ | 10-23 |
| $ZrO_2$ | 0-5 |
| $Al_2O_3$ | 0-5 |
| $SnO_2$ | 0-5 |
| $ZrO_2 + Al_2O_3 + SnO_2$ | 0-5 |

The patent describes melting batches for the above compositions, forming glass frits from the melts, applying a coating of the frits onto the surface of a metal substrate (most preferably low carbon steel), and then firing the coated substrate at a temperature of at least 750° C., more desirably 800°-850° C., for a sufficient length of time to cause the frit to essentially simultaneously fuse together to an integral mass and crystallize in situ, this time commonly ranging about 5-30 minutes. The resultant coating is highly crystalline, 50-90% by volume, with the remainder consisting of residual glass. The primary crystal phase comprises $BaO.2MO.2SiO_2$, wherein MO consists of MgO with, optionally, CaO and/or ZnO, and the secondary crystal phase comprises $2MO.B_2O_3$, wherein MO again consists of MgO with, optionally, CaO and/or ZnO. The crystallized coatings demonstrate high coefficients of thermal expansion, typically $110 \times 10^{-7}/°$ C. and above, over the range of 0° C. to the deformation temperature of the material (>700° C.). Such coefficients of thermal expansion are useful in matching the high coefficients of thermal expansion of the metal substrates employed, e.g., the preferred low carbon steels.

Although those patented compositions provide coatings far superior to the previously-available porcelain coatings, the need has been observed for materials exhibiting even greater refractoriness, better electrical properties, and, desirably, lower coefficients of thermal expansion for use with substrates prepared from alloys manifesting expansion coefficients lower than those of low carbon steels. Therefore, the primary objective of the instant invention is to provide crystallized glass or glass-ceramic coatings which satisfy that need.

SUMMARY OF THE INVENTION

That objective can be attained in essentially alkali metal-free, glass-ceramic coatings having compositions within the MgO-CaO and/or $ZnO-SiO_2$ system with, optionally, $Al_2O_3$ and/or $B_2O_3$. Thus, the compositions consist essentially, expressed in weight percent on the oxide basis, of 5-35% MgO, 0-35% CaO, 0-25% ZnO, 10-35% CaO+ZnO, 0-10% $Al_2O_3$, 0-25% $B_2O_3$, 0-10% $P_2O_5$, 4-25% $B_2O_3+P_2O_5$, and 25-50% $SiO_2$. Where CaO is present, the preferred compositions will consist essentially of 5-25% MgO, 15-35% CaO, 0-15% ZnO, 0-10% $P_2O_5$, 0-10% $Al_2O_3$, 6-25% $B_2O_3$, and 30-50% $SiO_2$. When the coating contains no CaO, the preferred compositions will consist essentially of 25-35% MgO, 5-25% ZnO, 10-25% $B_2O_3$, and 25-35% $SiO_2$. Where CaO is present, the predominant crystal phase developed is diopside ($CaO.MgO.2SiO_2$) and akermanite ($2C_2O.MgO.2SiO_2$). In those coatings containing no CaO, three crystal phases will commonly be generated in significant amounts, viz., magnesium borate ($2MgO.B_2O_3$), willemite ($2ZnO.SiO_2$), and enstatite ($MgO.SiO_2$), the quantity of each being governed by the base composition, particularly the ZnO content.

The inventive coatings can be fired repeatedly to temperatures greater than 950° C. and, in some compositions, in excess of 1000° C. with no deformation or other deleterious effect taking place, and the coefficients of thermal expansion (25°-600° C.) can range between about $80-125 \times 10^{-7}/°$ C.

In general, it is preferred that the coating have a coefficient of thermal expansion somewhat less than that of the substrate material such that, after firing and cooling to room temperature, the coating will be under conpression, thereby inhibiting cracking, crazing, and spalling thereof. The inventive materials are well-suited as coatings for $Al_2O_3$, which has a coefficient of thermal expansion (25°–600° C.) of about 90, and for such high temperature, titanium-stabilized stainless steels as 430 Ti, marketed by Carpenter Technology Corporation, Reading, Pa., Vitrenamel, marketed by U.S. Steel Corporation, Pittsburgh, Pa. and Ti-Namel, marketed by Inland Steel Company, Chicago, Ill. The expansions of those latter materials can vary between about $110-140 \times 10^{-7}/°$ C. over the range of 25°–600° C.

The method for preparing and applying the inventive coatings involves five fundamental steps:

First, a glass-forming batch of a predetermined formulation is melted;

Second, the melt is cooled to a glass and the glass comminuted to a fine powder or frit;

Third, a liquid slurry is prepared of the frit;

Fourth, the slurry is applied as a coating onto a surface of a desired substrate; and Fifth, the coated substrate is fired to temperatures of at least 850° C. to fuse the frit particles together into an integral, essentially non-porous, vitreous coating and substantially immediately thereafter to cause extensive crystallization in situ to take place therein.

In general, to insure adequate flow of the glass during sintering, thereby providing an essentially "pinhole-free" coating, and to develop a high volume of crystallinity, the frit will desirably be powdered to particles passing a 325 United States Standard Sieve (44 microns). An aqueous slurry can be employed although, for certain deposition techniques, organic vehicles are preferred. Also, organic vehicles have appeared to impart more sound coatings with a wide variety of frit compositions than water.

Numerous practices for applying the slurry to a substrate are feasible, including, among others, the simple pouring on of the slurry, immersing the substrate into the slurry, spraying the slurry onto the substrate, and electrophoretic deposition, the latter two techniques customarily providing more uniform coatings. The operable concentrations of powder and vehicle depend upon the method utilized to apply the slurry and can readily be determined empirically. For example, where a slurry is prepared utilizing a relatively volatile organic vehicle, e.g., 2-propanol, the content of the vehicle will be maintained between about 70–90 ml/100 grams of powder. Thus, when the quantity of vehicle is too great, the deposited coating tends to run. Conversely, when the liquid content is too low, the inherent rapid evaporation of the vehicle leaves insufficient liquid and the deposited coating assumes a loose and fluffy character. Good uniformity and high density of the deposited coating are essential since, by nature, the flow during glazing (fusing) is quite limited and any defects in the deposit manifest themselves after firing.

Sintering or fusing will typically be conducted at temperatures between about 850°–1000° C. for periods of time varying from a few minutes at the upper extreme of the range to about 15 minutes at the cooler end thereof. Longer intervals of firing are operable but the final coating does not appear to demonstrate such a significant improvement in character as to warrant the additional expense attendant to extended firing schedules.

The inventive materials appear to be unaffected by the atmosphere employed in the firing step, but the substrate material, e.g., Vitrenamel, may require the use of an inert or reducing environment to prevent oxidation thereof. Again, the need for such conditions can be readily determined empirically.

Minor amounts of compatible metal oxides such as SrO, PbO, and $Bi_2O_3$ may be included so long as the coefficient of thermal expansion of the final coating is not raised significantly or the refractoriness of the coating reduced substantially. Typically, such additions will not exceed about 10%. Likewise, conventional glass colorants may be included in customary amounts.

DESCRIPTION OF THE PREFERRED EMBODIMENTS

The following Table I sets forth a number of exemplary glasses, expressed in terms of parts by weight on the oxide basis, illustrative of compositions operable in the invention. However, because the sum of the individual components totals or approximately totals 100, for all practical purposes the values reported may be deemed to reflect weight percent. The actual batch ingredients may comprise any materials, either the oxide or other compound, which, when melted together with the other constituents, will be converted into the desired oxide in the proper proportions.

The batch components were compounded, ballmilled together to aid in securing a homogeneous melt and deposited into platinum crucibles. The crucibles were moved to a furnace operating at about 1350°–1450° C. and the batches melted for about four-to-six hours. (Where present, the loss of $B_2O_3$ through volatilization was estimated to range about 10%). The melts were poured as a fine stream into a container of water (drigaged) to produce rather finely-divided particles of glass. The glass particles were dried and thereafter ballmilled to pass a 325 mesh screen.

TABLE I

|  | 1 | 2 | 3 | 4 | 5 | 6 | 7 |
|---|---|---|---|---|---|---|---|
| $SiO_2$ | 25.0 | 30.0 | 35.0 | 30.0 | 30.0 | 30.0 | 33.0 |
| $B_2O_3$ | 20.0 | 15.0 | 10.0 | 20.0 | 15.0 | 17.5 | 19.0 |
| ZnO | 25.0 | 25.0 | 25.0 | 25.0 | 20.0 | 17.5 | 13.0 |
| MgO | 30.0 | 30.0 | 30.0 | 30.0 | 35.0 | 35.0 | 35.0 |
|  | 8 | 9 | 10 | 11 | 12 | 13 | 14 |
| $SiO_2$ | 37.2 | 39.2 | 41.8 | 37.1 | 35.2 | 33.2 | 35.2 |
| $Al_2O_3$ | 3.6 | 3.6 | — | 4.0 | 3.8 | 3.6 | 3.6 |
| CaO | 26.0 | 26.0 | 32.7 | 28.9 | 27.5 | 26.0 | 26.0 |
| MgO | 18.5 | 18.5 | 13.6 | 12.4 | 13.4 | 18.5 | 20.5 |
| $B_2O_3$ | 8.4 | 6.4 | 11.8 | 17.7 | 15.1 | 12.4 | 8.4 |
| ZnO | 6.3 | 6.3 | — | — | 6.7 | 6.3 | 6.3 |
|  | 15 | 16 | 17 | 18 | 19 | 20 | 21 | 22 |
| $SiO_2$ | 46.0 | 37.2 | 42.5 | 42.6 | 40.7 | 39.9 | 42.2 | 41.4 |
| CaO | 34.4 | 26.0 | 25.4 | 25.6 | 28.7 | 23.9 | 29.8 | 24.8 |
| MgO | 6.3 | 20.5 | 17.0 | 17.0 | 10.4 | 16.0 | 10.8 | 16.6 |
| $Al_2O_3$ | 5.0 | 3.6 | 5.1 | 2.7 | 6.0 | 6.0 | 4.5 | 4.5 |
| $P_2O_5$ | — | — | — | 4.2 | 9.4 | 9.4 | 9.8 | 9.8 |
| $B_2O_3$ | 8.2 | 6.4 | 9.9 | — | 3.9 | 3.9 | 2.0 | 2.0 |
| NiO | — | — | — | — | 0.8 | 0.8 | 0.8 | 0.8 |
| ZnO | — | 6.3 | — | — | — | — | — | — |

A simple test was devised to provide a rough evaluation of the applicability of the compositions for the desired coatings. This procedure involved pressing circular buttons having diameters of about 0.5" and heights of about 0.5" from frit powdered to pass a 325 mesh screen combined with a small amount of vehicle.

The buttons were plunged into a furnace operating at 850°–950° C. and retained therein for 15 minutes. Visual observation of the fired buttons can discern the degree of flow, the extent of crystallization, the size of the crystals, and the surface quality developed. Those compositions present as secured via X-ray diffraction analysis, and a measurement of the coefficient of thermal expansion (25°–600° C.) expressed in terms of $\times 10^{-7}/°$ C. conducted on pressed, fired bars in accordance with techniques conventional in the art.

TABLE II

|  | 1 | 2 | 3 | 4 | 5 | 6 | 7 |
| --- | --- | --- | --- | --- | --- | --- | --- |
| Button Flow (950°-0.25 hr) | 4 | 3 | 2 | 3 | 2 | 2 | 2-3 |
| Crystal Size | Medium | Medium | Fine | Medium | Fine-Medium | Fine | Fine |
| Crystallinity | Medium | High | High | High | High | High | High |
| Crystal Phases* | W(M) MB(VS) E(M) | W(S) MB(S) E(S) | W(M) MB(S) E(VS) | MB(M) W(M) E(M) | MB(S) W(M) E(M) | MB(S) W(M) E(M) | — — — |
| Coef. Exp. | — | 101 | 108 | 118 | 124 | 125 | 121 |
|  | 8 | 9 | 10 | 11 | 12 | 13 | 14 |
| Button Flow (900° C.-0.25 hr) | 4 | 3 | 3 | 3 | 4 | 3-4 | 4 |
| Crystal Size | Medium | Medium | Medium Coarse | Medium | Fine | Fine | Fine |
| Crystallinity | High | Medium | High | High | High | High | Medium |
| Crystal Phases* | D(VS) A(W) | D(M) A(W) | D(VVS) | D(VVS) | D(VVS) | D(VVS) E(M) | D(WS) A(W) |
| Coef. Exp. | 105 | 105 | 98 | 95 | 104 | 108 | — |
|  | 15 | 16 | 17 | 18 | 19 | 20 | 21 | 22 |
| Button Flow (970° C.-0.25 hr) | 4 | 3 | 4 | 3 | 4 | 3 | 3 | 3 |
| Crystal Size | Medium | Fine | Medium | Fine | Very Fine | Fine | Fine | Fine |
| Crystallinity | High | Medium | High | Medium | High | High | High | High |
| Crystal Phase* | D(VVS) | D(W) A(M) | D(VVS) | D(VVS) | D(VVS) | D(VVS) | D(VVS) | D(VVS) |
| Coef. Exp. | 81 | 107 | — | 100 | 106 | 91 | 99 | — |

*W = Willemite, MB = $2MgO.B_2O_3$, E = Enstatite, ZB = Zinc Borate believed to be mixture of $ZnO.2B_2O_3$, $\alpha\text{-}ZnO.B_2O_3$, $\alpha\text{-}5ZnO.2B_2O_3$, D = Diopside, A = Akermanite($2CaO.MgO.2SiO_2$)
VVS = Very very strong peak in the X-ray diffraction pattern, VS = Very strong peak, S = Strong peak, M = Medium peak, W = Weak peak, VW = Very weak peak positions displaying good flow and extensive crystallization were examined via X-ray diffraction analysis and the coefficient of thermal expansion measured on pressed bars having the dimensions of about $2'' \times 0.5'' \times 0.25''$.

A qualitative assessment of the degree of flow was undertaken on an arbitrary 1–5 scale with increasing flow. On that scale, 1 indicated sintering only with no flow, 2 reflected slightly rounded edges with very little flow, 3 represented rounded edges with good flow, 4 signified complete slumping of the button, i.e., high flow, and 5 showed the remains of a puddle indicating very high flow. Experience has demonstrated that the flow must exhibit a value of 3 on the above scale to be sufficient to yield essentially "pinhole-free" coatings. A flow level of 2 may be improved in some compositions by increasing the firing temperature. Extending the time of firing will normally not increase the extent of flow since the glasses tend to crystallize extremely rapidly. Hence, the flow occurring prior to crystallization comprises the major portion of flow at a given temperature.

Table II sets forth a visual assessment of the degree of flow observed in the above-described button test, a qualitative determination of the amount of crystallinity present (highly crystalline being deemed to be considerably in excess of 50% by volume crystalline and medium crystallinity to be about 50% by volume or somewhat less) and the average diameter of the crystals (fine = no more than 5 microns; medium = 5–10 microns; medium-coarse = 10–20 microns) as viewed by electron microscope examination, the identity of the crystal phases present as secured via X-ray diffraction analysis, and a measurement of the coefficient of thermal expansion.

As was noted previously, the use of an organic vehicle, rather than water, appeared to produce more uniform coatings. For example, operable suspensions have been prepared from such liquids as methanol, ethanol, 1-propanol, 2-propanol, 1-butanol, 2-butanol, and amyl acetate with nitrocellulose binder. The best coatings in terms of density, uniformity, and rate of deposition were prepared with 2-propanol.

Experience has demonstrated that 2-propanol provides better deposits than 1-propanol and 2-butanol better coatings than 1-butanol. The steric hindrance due to the absorbed molecule appears to make 2-propanol and 2-butanol more effective than 1-propanol and 1-butanol respectively. The OH$^-$ group is attached at the side of the carbon chain in 2-propanol instead of at the end thereof. It has been recognized that, typically, a side attachment of this kind makes for a better suspension of particles therein.

The use of methanol as a vehicle results in a very rapid rate of deposition but frequently the coating tends to be rather loose such that the fired coating is not as uniform as would be desired.

Electrophoretic deposition has consistently appeared to yield the best coatings. The process, however, must be carried out with constant stirring because of the strong tendency of the particles to settle out. As is well known, the effectiveness of electrophoretic deposition is dependent upon such factors as voltage, current, the concentration of particles, particle size, and time of deposition. The following ranges of conditions have proven satisfactory in producing desirable coatings:

TABLE III

|  | 5 | 12 | 15 | 18 | 19 | 20 | 21 |
|---|---|---|---|---|---|---|---|
| Volume Resistivity (log ρ) | 12.1 | 13.5 | 14.5 | 15.1 | 14.7 | 14.6 | 12.7 |
|  | 311° C. | 341° C. | 294° C. | 201° C. | 199° C. | 250° C. | 184° C. |
| Loss Tangent (25° C.) |  |  |  |  |  |  |  |
| 100 Hz | 0.020 | 0.018 | 0.0000 | 0.0000 | 0.0000 | 0.0000 | 0.0000 |
| 1K Hz | 0.012 | 0.014 | 0.0037 | 0.0070 | 0.0060 | 0.0030 | 0.0050 |
| 10K Hz | 0.008 | 0.006 | 0.0030 | 0.0070 | 0.0050 | 0.0040 | 0.0050 |
| Dielectric Constant (25° C.) |  |  |  |  |  |  |  |
| 100 Hz | 6.55 | 6.60 | 4.68 | 4.87 | 5.05 | 6.39 | 6.27 |
| 1K Hz | 6.40 | 6.42 | 4.68 | 4.84 | 5.01 | 6.10 | 6.19 |
| 10K Hz | 6.32 | 6.33 | 4.65 | 4.78 | 4.96 | 6.07 | 6.13 |
| Dielectric Breakdown (KV/0.001" thickness) | 0.93 | 1.64 | — | 1.1 | 1.5 | 1.1 | 1.3 |

Concentration of particles: 15-200 grams/100 ml liquid
Particle size: <325 mesh, preferably 5-20 micron average
Voltage: 50-200 dc volts
Electrode distance: 1-3 cm.
Time to achieve 0.006" thick fired coating:
  5 seconds for high concentration
  1 minute for low concentration The deposited coatings are dried and any organic binder optionally present removed by heating to several hundred degrees centigrade. Thereafter, the coatings are fired by plunging into a preheated furnace operating at temperatures within the range of 850°-1000° C.

A typical firing sequence, when the temperature has been properly selected, comprises the vitrification of the deposited particles in a time of about one minute followed by crystallization thereof in the next 20-30 seconds. Crystallization is complete within the next 1.5-2 minutes so that the total firing time will customarily average about 3-5 minutes. Further firing has little effect upon the phase assemblage. This sequence can be visually followed during the sintering or fusing operation by observing changes in opaqueness exhibited by the material. Hence, complete vitrification yields a transparent body with the gradual development of opacity being due to the generation of crystals therein.

It is believed that substantially all flow takes place during the short period of the vitrified state. Accordingly, the glassy state must display sufficient fluidity to uniformly and completely cover the substrate. However, unlike conventional vitreous glaze coatings, the inventive crystallizing coating does not form a large meniscus around holes and edges during firing.

Table III reports various electrical properties measured on coatings prepared from several of the exemplary compositions recited in Table I electrophoretically deposited upon 1"×2"×0.045" strips of 430 Ti stainless steel utilizing 2-propanol as the vehicle and fired in air at 900° C. for four minutes to a thickness of about 0.005-0.007".

We claim:
1. Glass-ceramic coating compositions capable of being fired repeatedly to temperatures greater than 950° C. without undergoing thermal deformation, exhibiting coefficients of thermal expansion (25°-600° C.) between about $80-125 \times 10^{-7}/°$ C., and being substantially free from alkali metal oxides consisting essentially, expressed in terms of weight percent on the oxide basis, of:

| MgO | 5-35 |
|---|---|
| CaO | 0-35 |
| ZnO | 0-25 |
| CaO + ZnO | 10-35 |
| $Al_2O_3$ | 0-10 |
| $B_2O_3$ | 0-25 |
| $P_2O_5$ | 0-10 |
| $B_2O_3 + P_2O_5$ | 4-25 |
| $SiO_2$ | 25-50 |

2. Glass-ceramic coating compositions according to claim 1 consisting essentially of:

| MgO | 5-25 |
|---|---|
| CaO | 15-35 |
| $Al_2O_3$ | 0-10 |
| $B_2O_3$ | 6-25 |
| ZnO | 0-15 |
| $P_2O_5$ | 0-10 |
| $SiO_2$ | 30-50 |

3. Glass-ceramic coating compositions according to claim 1 consisting esentially of:

| MgO | 25-35 |
|---|---|
| ZnO | 5-25 |
| $B_2O_3$ | 10-25 |
| $SiO_2$ | 25-35 |

* * * * *